(12) United States Patent
Kobayashi

(10) Patent No.: US 10,389,311 B1
(45) Date of Patent: Aug. 20, 2019

(54) LOAD MODULATION AMPLIFIER

(71) Applicant: Qorvo US, Inc., Greensboro, NC (US)

(72) Inventor: Kevin Wesley Kobayashi, Redondo Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/884,605

(22) Filed: Jan. 31, 2018

(51) Int. Cl.
*H03F 3/68* (2006.01)
*H03F 1/32* (2006.01)
*H03F 3/21* (2006.01)
*H03F 3/19* (2006.01)
*H03F 1/56* (2006.01)
*H03F 1/02* (2006.01)

(52) U.S. Cl.
CPC ............ *H03F 1/32* (2013.01); *H03F 1/0288* (2013.01); *H03F 1/56* (2013.01); *H03F 3/19* (2013.01); *H03F 3/21* (2013.01); *H03F 2200/204* (2013.01); *H03F 2200/387* (2013.01); *H03F 2200/451* (2013.01)

(58) Field of Classification Search
CPC .................................. H03F 1/0288; H03F 3/68
USPC .............................................. 330/124 R, 295
See application file for complete search history.

(56) References Cited

U.S. PATENT DOCUMENTS

| | | | |
|---|---|---|---|
| 9,484,865 B2 | 11/2016 | Kobayashi et al. | |
| 9,887,671 B2 | 2/2018 | Kobayashi et al. | |
| 9,948,243 B2 | 4/2018 | Kobayashi et al. | |
| 2011/0183636 A1* | 7/2011 | Staudinger | H03F 1/0222 455/102 |
| 2012/0105147 A1* | 5/2012 | Harris | H03F 1/56 330/57 |
| 2014/0375389 A1* | 12/2014 | Jeon | H03F 1/0288 330/295 |
| 2015/0091653 A1 | 4/2015 | Kobayashi et al. | |
| 2017/0019071 A1 | 1/2017 | Kobayashi et al. | |
| 2017/0019072 A1 | 1/2017 | Kobayashi et al. | |

OTHER PUBLICATIONS

Andersson, K., et al., "GaN Powers Microwave Point-to-Point Radios," Microwave Journal, vol. 60, No. 2, Feb. 2017, pp. 22-34.

(Continued)

*Primary Examiner* — Steven J Mottola
(74) *Attorney, Agent, or Firm* — Withrow & Terranova, P.L.L.C.

(57) ABSTRACT

A load modulation amplifier is disclosed. The load modulation amplifier includes a carrier amplifier for amplifying a radio frequency signal when input power of the radio frequency signal is below a predetermined power threshold value and a peak amplifier coupled in parallel with the carrier amplifier for amplifying the radio frequency signal when input power of the radio signal is above the predetermined power threshold value. The load modulation amplifier further includes an output quadrature coupler configured to combine power from both the carrier amplifier and the peak amplifier for output through an output load terminal. Output impedance of the peak amplifier monotonically increases with increasing output power at the output load terminal.

21 Claims, 14 Drawing Sheets

(56) References Cited

OTHER PUBLICATIONS

Kobayashi, K. W., et al., "An 18-21 GHz InP DHBT Linear Microwave Doherty Amplifier," 2000 IEEE Radio Frequency Integrated Circuits (RFIC) Symposium, Jun. 10-13, 2000, Boston, Massachusetts, USA, pp. 179-182.

Kobayashi, K. W., et al., "Indium Phosphide Heterojunction Bipolar Transistor Technology for Future Telecommunications Applications," Microwave Journal, Jul. 1999, 12 pages.

Pednekar, P. H., et al., "RF-Input Load Modulated Balanced Amplifier," 2017 IEEE MTT-S International Microwave Symposium (IMS), Jun. 4-9, 2017, Honolulu, Hawaii, USA, 4 pages.

Shepphard, D. J., et al., "An Efficient Broadband Reconfigurable Power Amplifier Using Active Load Modulation," IEEE Microwave and Wireless Components Letters, vol. 26, No. 6, Jun. 2016, pp. 443-445.

Shepphard, D. J., et al., "A Broadband Reconfigurable Load Modulated Balanced Amplifier (LMBA)," 2017 IEEE MTT-S International Microwave Symposium (IMS), Jun. 4-9, 2017, Honolulu, Hawaii, USA, 3 pages.

\* cited by examiner

LOAD MODULATION AMPLIFIER

RELATED APPLICATIONS

This application is related to U.S. Pat. No. 9,484,865, issued Nov. 1, 2016, titled RECONFIGURABLE LOAD MODULATION AMPLIFIER; U.S. patent application Ser. No. 15/278,450, filed Sep. 28, 2016, now U.S. Pat. No. 9,887,671, titled RECONFIGURABLE LOAD MODULATION AMPLIFIER; and U.S. patent application Ser. No. 15/278,270, filed Sep. 28, 2016, now U.S. Pat. No. 9,948,243, titled RECONFIGURABLE LOAD MODULATION AMPLIFIER, the disclosures of which are hereby incorporated herein by reference in their entireties.

FIELD OF THE DISCLOSURE

The present disclosure pertains to amplifiers and in particular to load modulation amplifiers having a carrier amplifier and a peak amplifier coupled in parallel.

BACKGROUND

Traditional Doherty power amplifiers have been employed to improve high power backed off efficiency over a wide power range. However, as frequency increases, Doherty power amplifier performance degrades overall due to amplifier device parasitic capacitance and inductance. At around 15 GHz, backed off efficiency of Doherty power amplifiers begins to decay linearly with frequency. Therefore, challenges remain with regard to maintaining desirable output backed off efficiency at fifth-generation (5G) wireless network millimeter wave frequencies that include 28 GHz, 38 GHz, and 60 GHz. Moreover, 5G wireless networks employing phased array applications are constrained by cost, complexity, and output power linearity. Further still, digital pre-distortion techniques are undesirable as solutions to non-linear Doherty operation at millimeter wave frequencies. Therefore, a need remains for a load modulation power amplifier that provides both output power backed off efficiency and linear operation without digital pre-distortion for operation at 5G wireless network millimeter wave frequencies.

SUMMARY

A load modulation amplifier is disclosed. The load modulation amplifier includes a carrier amplifier for amplifying a radio frequency signal when input power of the radio frequency signal is below a predetermined power threshold value and a peak amplifier coupled in parallel with the carrier amplifier for amplifying the radio frequency signal when input power of the radio signal is above the predetermined power threshold value. The load modulation amplifier further includes an output quadrature coupler configured to combine power from both the carrier amplifier and the peak amplifier for output through an output load terminal. Output impedance of the peak amplifier monotonically increases with increasing output power at the output load terminal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
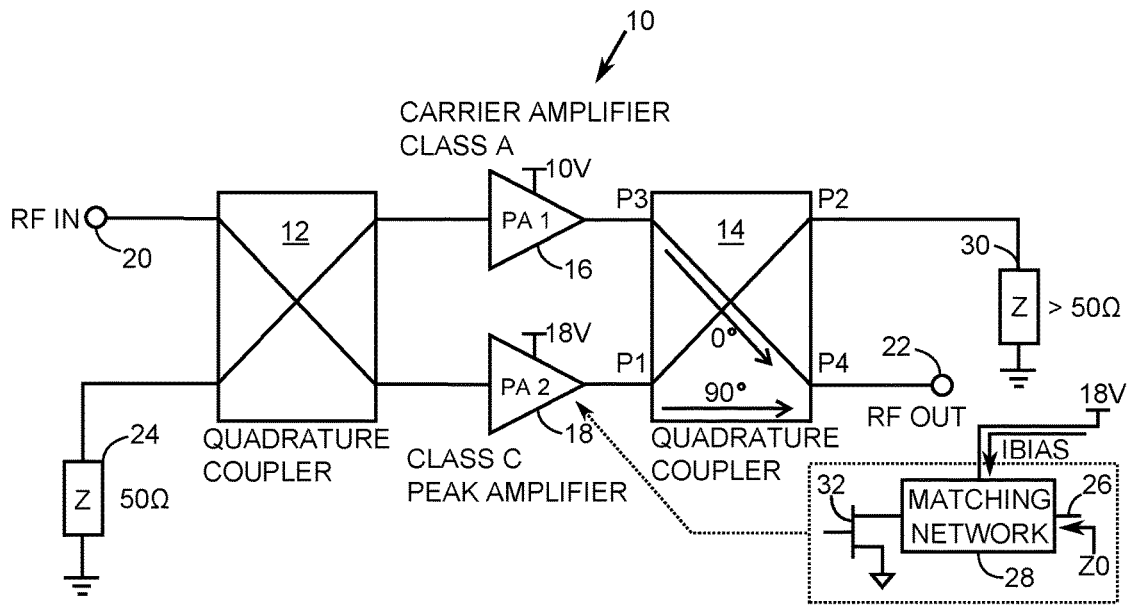
FIG. 1 is a schematic of a first embodiment of a load modulation amplifier that is structured and configured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic of a first embodiment of a load modulation amplifier 10 that is structured and configured in accordance with the present disclosure. In exemplary embodiments both an input quadrature coupler 12 and an output quadrature coupler 14 each have four ports and are of the Lange type having microstrip or strip-line construction with geometric symmetry that ensures quadrature power combining of the output power of a carrier amplifier 16 and a peak amplifier 18. The carrier amplifier 16 and the peak amplifier 18 are coupled in parallel by way of the input quadrature coupler 12 at an input terminal 20 labeled RF IN and by way of the output quadrature coupler 14 at an output load terminal 22 labeled RF OUT.

The input quadrature coupler 12 and the output quadrature coupler 14 both typically have less than 0.25 dB of insertion loss and an approximate octave frequency operating bandwidth. For example, in one embodiment the input quadrature coupler 12 and the output quadrature coupler 14 are both Lange couplers having a minimum frequency of 12 GHz and a maximum frequency of 24 GHz. In another embodiment, the input quadrature coupler 12 and the output quadrature coupler 14 are both Lange couplers having a minimum frequency of 18 GHz and a maximum frequency of 36 GHz. In yet another embodiment, the input quadrature coupler 12 and the output quadrature coupler 14 are both Lange couplers having a minimum frequency of 27 GHz and a maximum frequency of 54 GHz.

An input impedance termination network 24 is coupled between an input termination port of the input quadrature coupler 12 and ground. A network output terminal 26 of a matching network 28 included with the peak amplifier 18 is coupled to a first port P1 of the output quadrature coupler 14. In at least one embodiment, the matching network 28 is made up of only passive electrical components having inductance, capacitance, and resistance. An isolation termination network 30 having fixed impedance that is higher than fixed impedance of the input impedance termination network 24 is coupled between a second port P2 of the output quadrature coupler 14 and ground. A bias current IBIAS for the peak amplifier 18 is set and/or controlled in combination with matching impedance of the matching network 28 such that an output impedance Z0 of the peak amplifier 18 seen at the network output terminal 26 increases monotonically with increasing output power of load modulation amplifier 10. In this exemplary embodiment, the bias current IBIAS is supplied to the peak amplifier 18 through the matching network 28.

In an exemplary embodiment, fixed impedance of the input impedance termination network 24 is 50Ω and the fixed impedance of the isolation termination network 30 is substantially greater than 50Ω, and in some exemplary embodiments, the fixed impedance of the isolation termination network 30 is on the order of 1000Ω. In the exemplary embodiment of FIG. 1, an amplified radio frequency signal that is output from the carrier amplifier 16 is input into a third port P3 and undergoes a 0° phase shift before exiting a fourth port P4 that is coupled to the output load terminal 22.

Moreover, in this exemplary embodiment, one or more gallium nitride field-effect transistors 32 feeds the matching network 28 an amplified copy of a radio frequency signal input at the input terminal 20. It should be noted that a bias point for the peak amplifier 18 may be set for other classes such as A or AB in order to configure the amplifier for a desired response.

Figure 2:
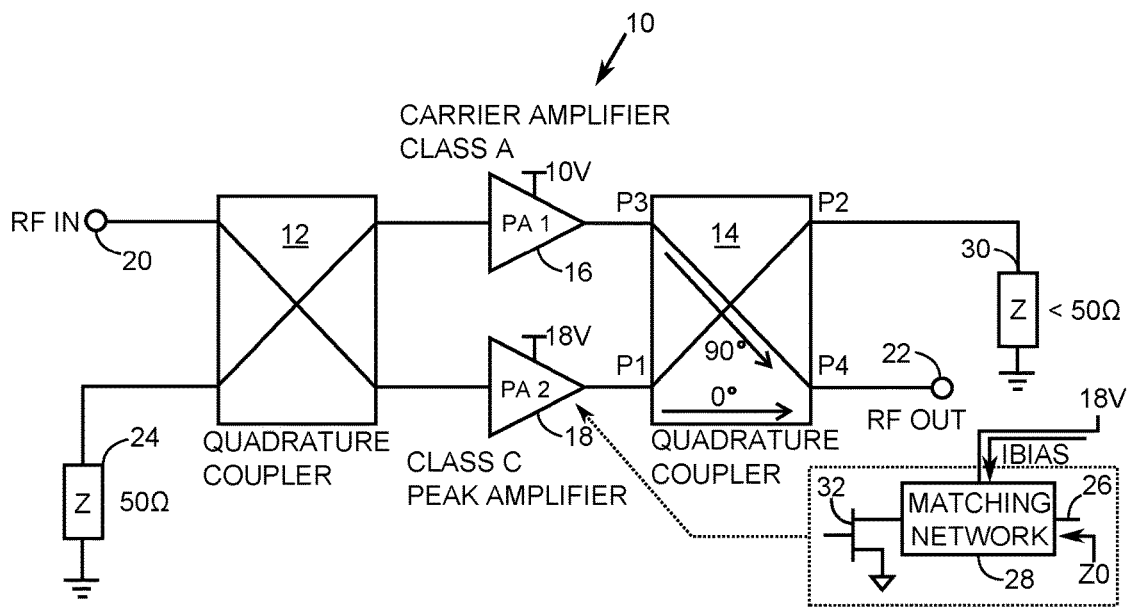
FIG. 2 is a schematic of a second embodiment of the load modulation amplifier that is structured and configured in accordance with the present disclosure.

FIG. 2 is a schematic of a second embodiment of the load modulation amplifier 10 that is structured and configured in accordance with the present disclosure. Exemplary embodiments of the load modulation amplifier 10 may be fabricated using 0.15 micron T-gate gallium nitride high electron mobility transistor technology with a transition frequency greater than 90 GHz. In the exemplary embodiment of FIG. 2, an amplified radio frequency signal that is output from the carrier amplifier 16 is input into the third port P3 and undergoes a 90° phase shift before exiting the fourth port P4 that is coupled to the output load terminal 22.

In some embodiments, the carrier amplifier 16 is biased with a first supply voltage and the peak amplifier 18 is biased with a second supply voltage, wherein the second supply voltage is between 10% and 50% greater than the first supply voltage. In some embodiments, the second supply voltage is between 50% and 100% greater than the first. In the exemplary embodiments of FIG. 1 and FIG. 2, the first supply voltage is 10 V and the second supply voltage is 18 V, which is 80% greater than the first supply voltage. In yet other embodiments, the second supply voltage is between 100% and 200% greater than the first supply voltage. In yet other embodiments, the second supply voltage is between 200% and 1000% greater than the first supply voltage.

Figure 3:
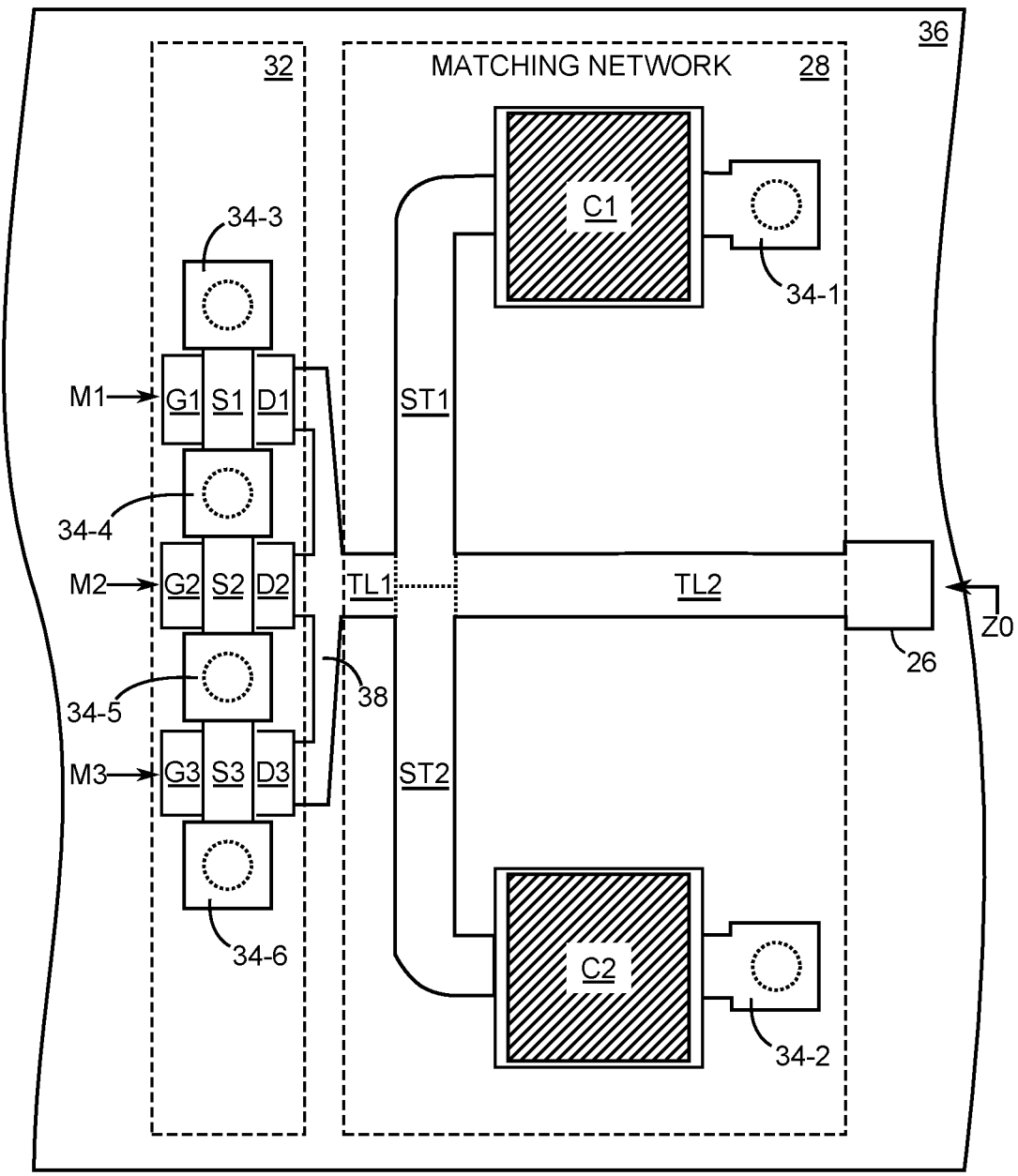
FIG. 3 is an exemplary circuit topology for the matching network.

FIG. 3 is an exemplary circuit layout for the matching network 28. In this example, the matching network is made of a first transmission line TL1 and a second transmission line TL2 that are coupled in series between the field-effect transistors 32 and the network output terminal 26. A first tuning stub ST1 and a second tuning stub ST2 are coupled to a node between the first transmission line TL1 and the second transmission line TL2. A first capacitor C1 is coupled between an outer end of the first tuning stub ST1 and a ground via pad 34-1. A dashed circle represents a via. A second capacitor C2 is coupled between an outer end of the second tuning stub ST2 and a ground via pad 34-2. In this exemplary case, a tuning of the first tuning stub ST1 and tuning of the second tuning stub ST2 in combination with bias current level setting of the bias current IBIAS is carried out to ensure that output impedance Z0 of the peak amplifier 18 (FIGS. 1 and 2) at the network output terminal 26 increases monotonically with increasing output power of load modulation amplifier 10.

In this exemplary embodiment, the matching network 28 and the field-effect transistors 32 are fabricated on a common substrate 36. In this example, the field-effect transistors 32 are individually labeled M1, M2, and M3. A radio frequency signal to be amplified is input at the gates G1, G2, and G3, respectively. Sources 51, S2, and S3 are coupled to ground via pads 34-3, 34-4, 34-5, and 34-6, respectively. Drains D1, D2, and D3 are coupled to the matching network 28 by way of a manifold 38. It is to be understood that other combinations of matching structures and bias points that are realizable to accomplish the monotonically increasing peak amplifier output impedance Z0, so the exemplary embodiment of FIG. 3 is non-limiting.

An exemplary iterative design method employs radio frequency integrated circuit (RFIC) simulation software that simulates performance of the embodiments of the load modulation amplifier 10. A goal of the exemplary design method is to ensure that output impedance Z0 of the peak amplifier 18 increases monotonically with increasing output power. At least another goal is to achieve efficient linear operation of the load modulation amplifier 10 at 10 dB output power backed off.

The exemplary iterative design method begins with choosing an appropriate circuit topology for the matching network 28. In an exemplary embodiment, an appropriate circuit topology is an L-network made up of microstrips. A model of the load modulation amplifier 10 including the circuit topology of the matching network 28 is then input into a digital computer executing the RFIC simulation software. Next steps include setting initial values for components making up the circuit topology and setting an initial current level for the bias current IBIAS. A simulation of the model of the load modulation amplifier 10 using the RFIC simulation software is invoked for the desired output power range, which is swept to generate simulated measurements of a scattering parameter S22 for the peak amplifier 18. Output impedance Z0 measurements may be derived from the scattering parameter S22 measurements. Either the scattering parameter S22 measurements or the output impedance Z0 measurements are processed to determine if the output impedance Z0 increases monotonically with increasing output power over a desired output power range that ensures the carrier amplifier is coupled at a lower output power level below predetermined power threshold value and decoupled at a higher output power level above the predetermined power threshold value.

If it is determined that the output impedance Z0 does not increase monotonically with increasing output power over the desired output power range, at least one component value of the matching network is adjusted and/or the bias current IBIAS is adjusted before the output power range is sweep again to generate new simulated measurements of the scattering parameter S22 for the peak amplifier 18. Either the new scattering parameter S22 measurements or the new output impedance Z0 measurements are processed to determine if the output impedance Z0 increases monotonically with increasing output power over the desired output power range. If the determination is positive, the method is complete and the load modulation amplifier 10 is realized and verified with laboratory testing. Otherwise, the iterative design method continues until the simulation indicates output impedance of the peak amplifier 18 increases monotonically with increasing output power at the output load terminal 22. It is to be understood that the iterative design method of the present disclosure may be entirely automated by way of additional program instructions executed by the digital computer that controls execution of the RFIC simulation software. Moreover, the program instructions may adjust values for components making up the circuit topology and/or current level for the bias current IBIAS in a genetic fashion that converges to a desired level of output power linearity.

Figure 4:
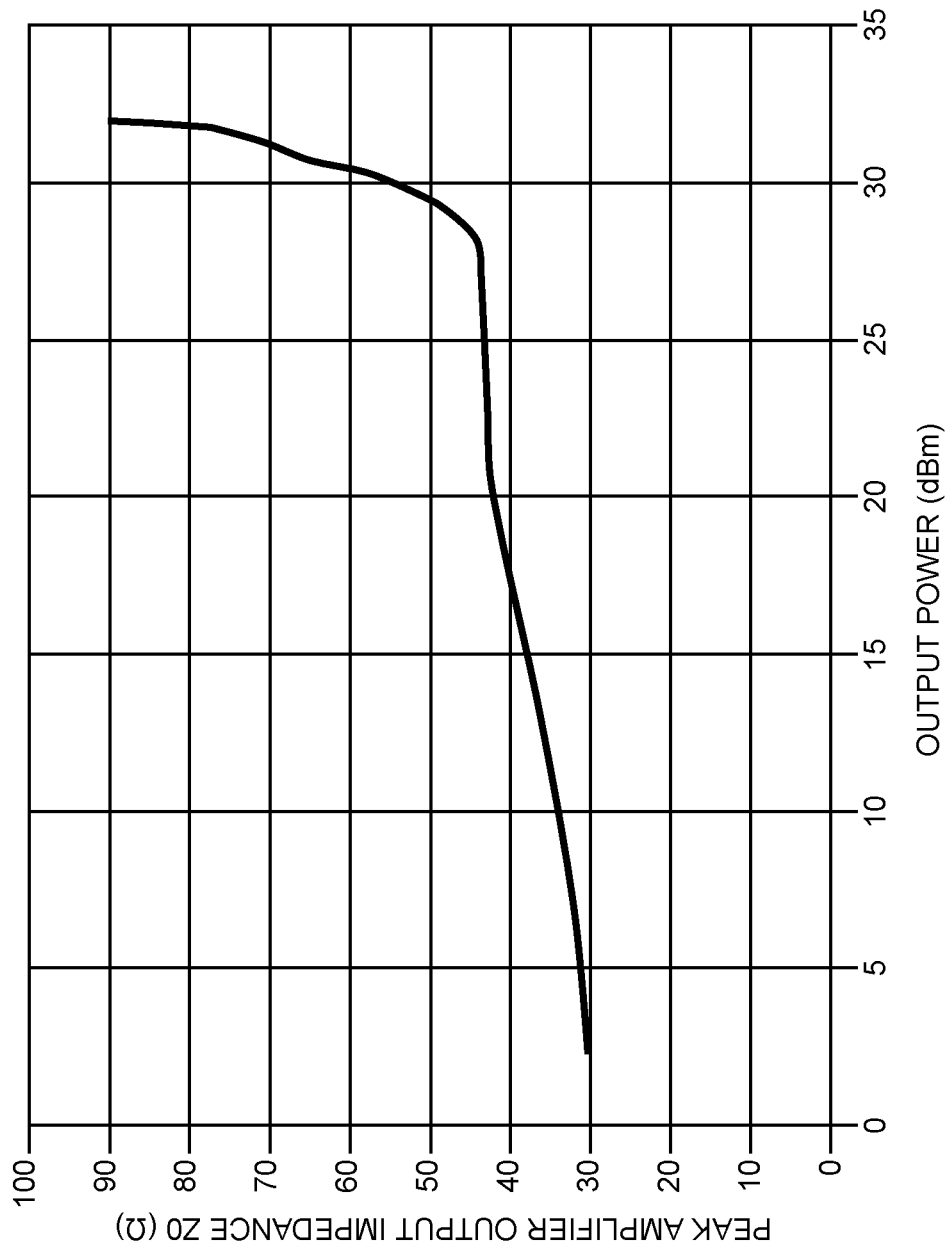
FIG. 4 is a graph of output impedance of the peak amplifier versus output power of the load modulation amplifier embodiments of the present disclosure.

FIG. 4 is a graph of output impedance Z0 of peak amplifier 18 versus output power for the load modulation amplifier 10. The graph of FIG. 4 shows an atypical yet highly desirable output impedance of the peak amplifier 18 that increases monotonically with increasing output power at the output load terminal 22 over a wide output power range of between 2.5 dBm and 35 dBm. In contrast, other types of amplifiers that have a peak amplifier such as a Doherty amplifier typically have decreasing output impedance with increasing power as the transistor of the peak amplifier dynamically biases up in current and do not have output impedance that increases monotonically with increasing output power.

In at least some exemplary embodiments of the load modulation amplifier 10, the load modulation amplifier 10 provides linear voltage gain to a radio frequency signal having a frequency between 15 GHz and 100 GHz. Other exemplary embodiments of the load modulation amplifier 10 provide linear voltage gain to a radio frequency signal having a frequency between 30 GHz and 50 GHz.

Figure 5:
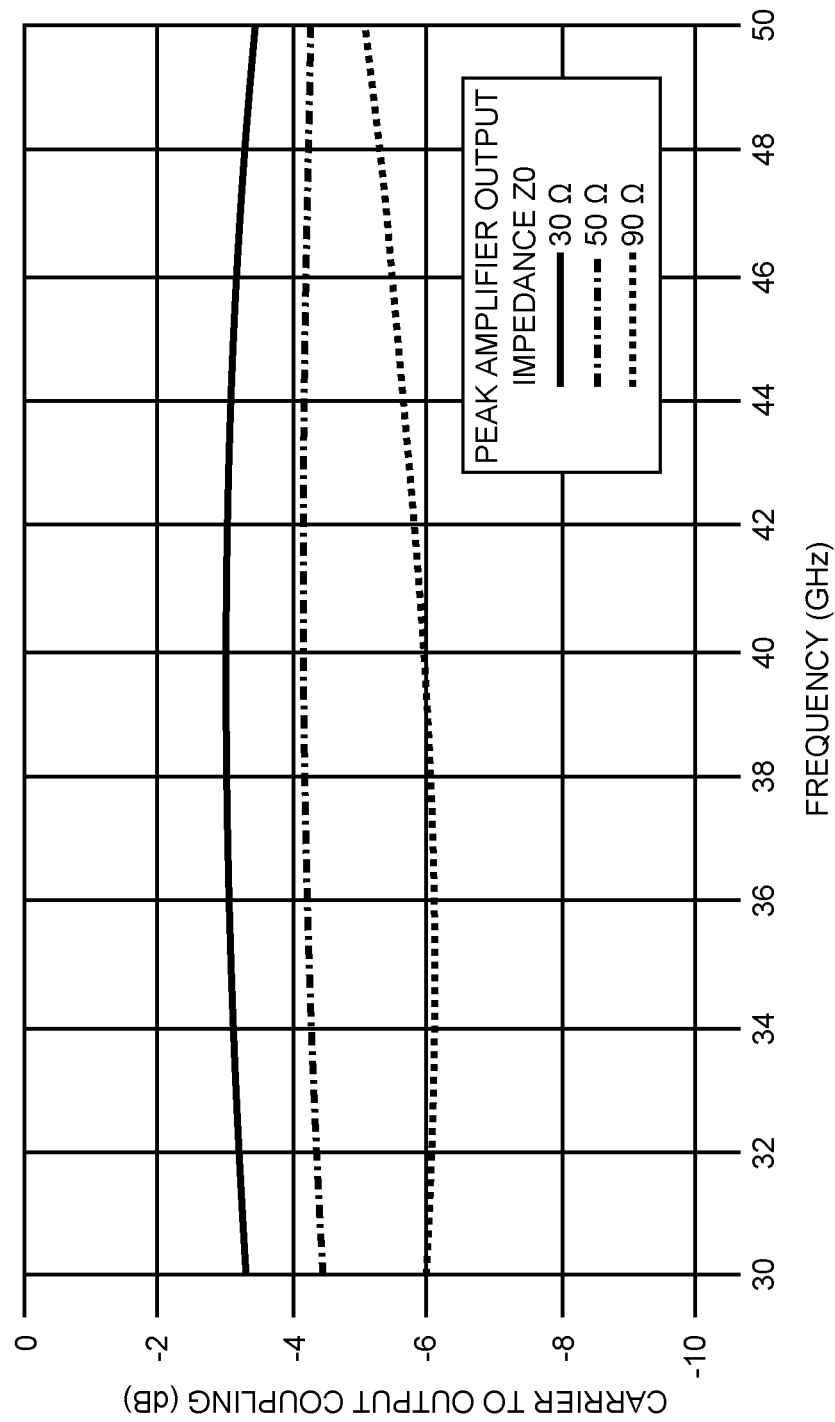
FIG. 5 is a graph of carrier amplifier to output coupling versus millimeter wave frequencies for the load modulation amplifier embodiments of the present disclosure.

The increase in output impedance of the peak amplifier 18 of the present embodiments effectively steers power delivered to the output from the carrier amplifier 16 to the peak amplifier 18. In at least one exemplary embodiment, the output impedance of the peak amplifier 18 monotonically increases between 30Ω and 100Ω with increasing output power between 2.5 dBm and 35 dBm at the output load terminal. In at least one other exemplary embodiment, the output impedance of the peak amplifier monotonically increases between 30Ω and 50Ω with increasing output power between 2.5 dBm and 29 dBm at the output load terminal. In at least one additional exemplary embodiment, the output impedance Z0 of the peak amplifier 18 monotonically increases between 50Ω and 100Ω with increasing output power between 29 dBm and 35 dBm at the output load terminal. In other embodiments, the output impedance Z0 of the peak amplifier 18 monotonically increases between 1.5 times and 4 times with increasing output power over an output power back-off (OPBO) range between 3 dB and 16 dB at the output load terminal The graphs of FIGS. 5-8 are generated from simulations of the second embodiment of the load modulation amplifier 10 of FIG. 2 with the isolation termination network 30 having isolation impedance that is less than 50Ω and specifically set at 0.1Ω for the simulations. FIG. 5 is a graph of carrier amplifier to output coupling versus millimeter wave frequencies for the load modulation amplifier embodiments of the present disclosure. In particular, the graph of FIG. 5 shows that the carrier amplifier 16 decouples from the output load terminal 22 as output impedance Z0 of the peak amplifier 18 increases. Referring back to the graph of FIG. 4, notice that at relatively low output power between 2.5 dBm and 5 dBm the output impedance Z0 of the peak amplifier 18 is close to 30Ω. As shown in FIG. 5 in solid line, the 30Ω output impedance Z0 of the peak amplifier 18 allows about a −3 dB coupling of the carrier amplifier's power to the output load terminal 22 over a frequency range extending from about 30 GHz to 50 GHz.

Referring back to the graph of FIG. 4, notice that at relatively moderate output power close to 29 dBm the output impedance Z0 of the peak amplifier 18 is close to 50Ω. As shown in FIG. 5 in dot-dash line, the 50Ω output impedance Z0 of the peak amplifier 18 allows only about a −4 dB coupling of the carrier amplifier's power to the output load terminal 22 over a frequency range extending from about 36 GHz to 50 GHz.

Referring back to the graph of FIG. 4 once again, notice that at relatively high output power close to 32 dBm the output impedance Z0 of the peak amplifier 18 is close to 90Ω. As shown in FIG. 5 in dashed line, the 90Ω output impedance Z0 of the peak amplifier 18 allows only about a −6 dB coupling of the carrier amplifier's power to the output load terminal 22 over a frequency range extending from about 30 GHz to 44 GHz. In the case of 90Ω output impedance Z0 of the peak amplifier 18, the contribution of the output power of the carrier amplifier 16 is small enough that the carrier amplifier 16 may be considered practically de-coupled from the output load terminal 22. Such steering of output power from the carrier amplifier 16 to the peak amplifier 18 for a relatively low isolation impedance of 0.1Ω would not occur with a Doherty-type amplifier because Doherty operation would not provide an increase in output impedance Z0 of the peak amplifier 18 as power increases.

Figure 6:
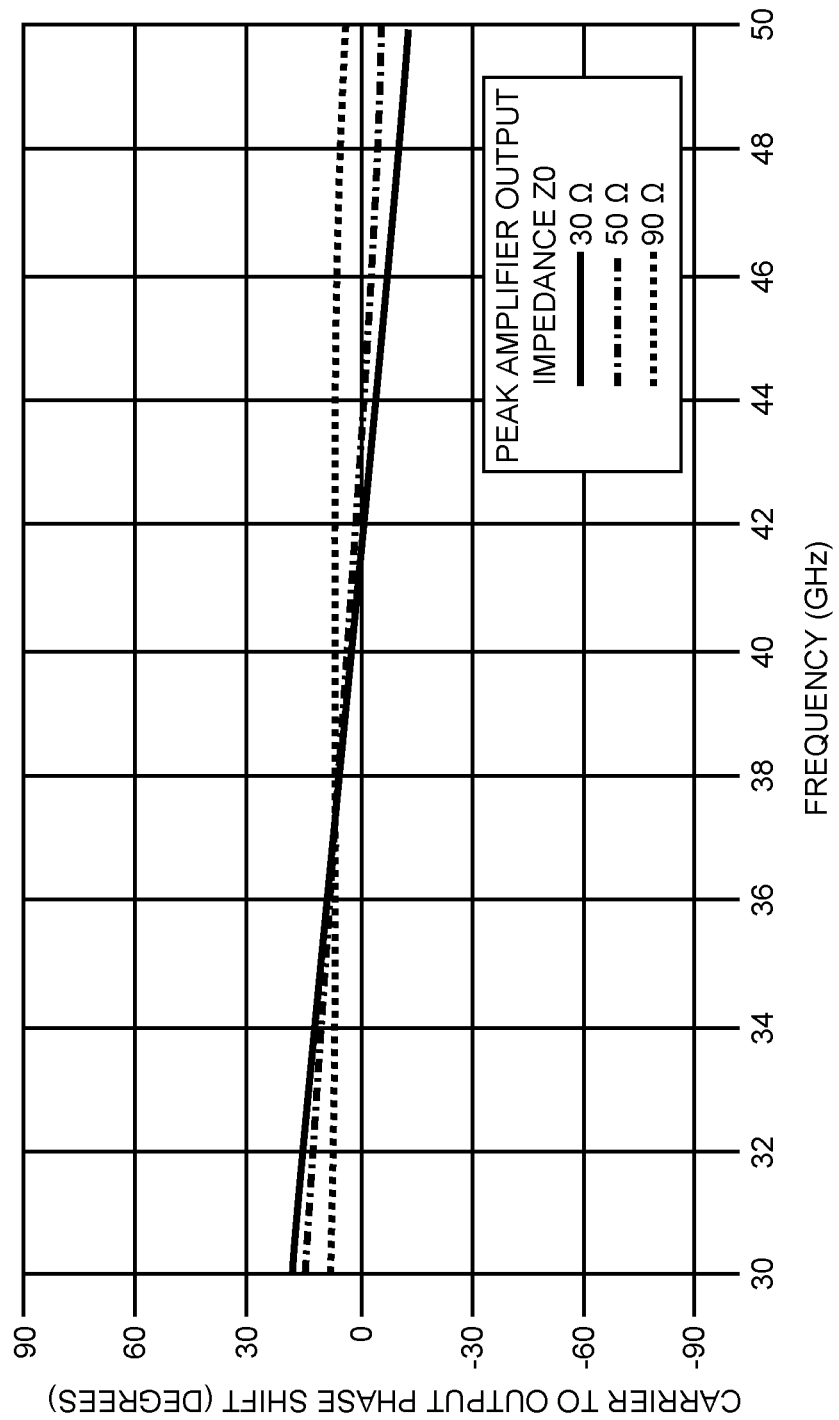
FIG. 6 is a graph of carrier amplifier to output phase shift versus millimeter wave frequencies for the load modulation amplifier embodiments of the present disclosure.

FIG. 6 is a graph of carrier amplifier to output phase shift versus millimeter wave frequencies for the load modulation amplifier embodiments of the present disclosure. Notice that carrier amplifier output phase shift through the output quadrature coupler 14 remains within ±20° of 0° between 30 GHz and 50 GHz for output impedance Z0 of the peak amplifier ranging between 30Ω and 90Ω.

Figure 7:
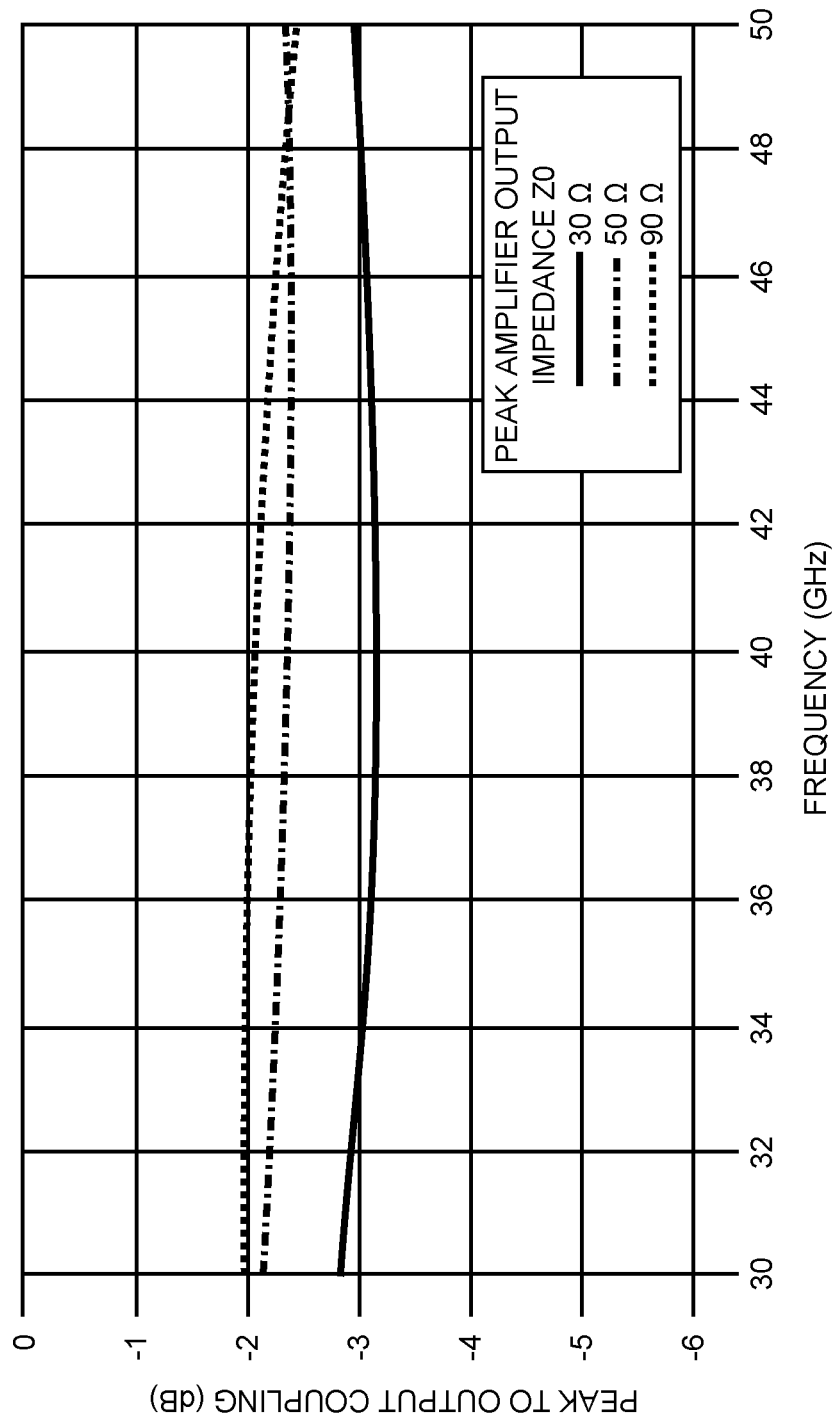
FIG. 7 is a graph of peak amplifier to output coupling versus millimeter wave frequencies for the load modulation amplifier embodiments of the present disclosure.

FIG. 7 is a graph of peak amplifier to output coupling versus millimeter wave frequencies for the load modulation amplifier embodiments of the present disclosure. In particular, the graph of FIG. 7 shows that the peak amplifier 18 couples to the output load terminal 22 as output impedance Z0 of the peak amplifier 18 increases. As shown in FIG. 7 in solid line, the 30Ω output impedance Z0 of the peak amplifier 18 allows about a −3 dB coupling of the peak amplifier's power to the output load terminal 22 over a frequency range extending from 30 GHz to 50 GHz. Moreover, as shown in FIG. 7 in dot-dash line, the 50Ω output impedance Z0 of the peak amplifier 18 yields a greater coupling of between just under −2 dB and −2.5 dB of the carrier amplifier's power to the output load terminal 22 over a frequency range extending from 30 GHz to 50 GHz. As further shown in FIG. 7 in dashed line, the 90Ω output impedance Z0 of the peak amplifier 18 provides between about −2 dB and −2.5 coupling of the carrier amplifier's power to the output load terminal 22 over a frequency range extending from 30 GHz to 50 GHz. In the case of the 90Ω output impedance Z0 of the peak amplifier 18, the contribution of the output power at the output load terminal 22 of the load modulation amplifier 10 is large enough that the peak amplifier 18 may be considered practically coupled to the output load terminal 22.

Figure 8:
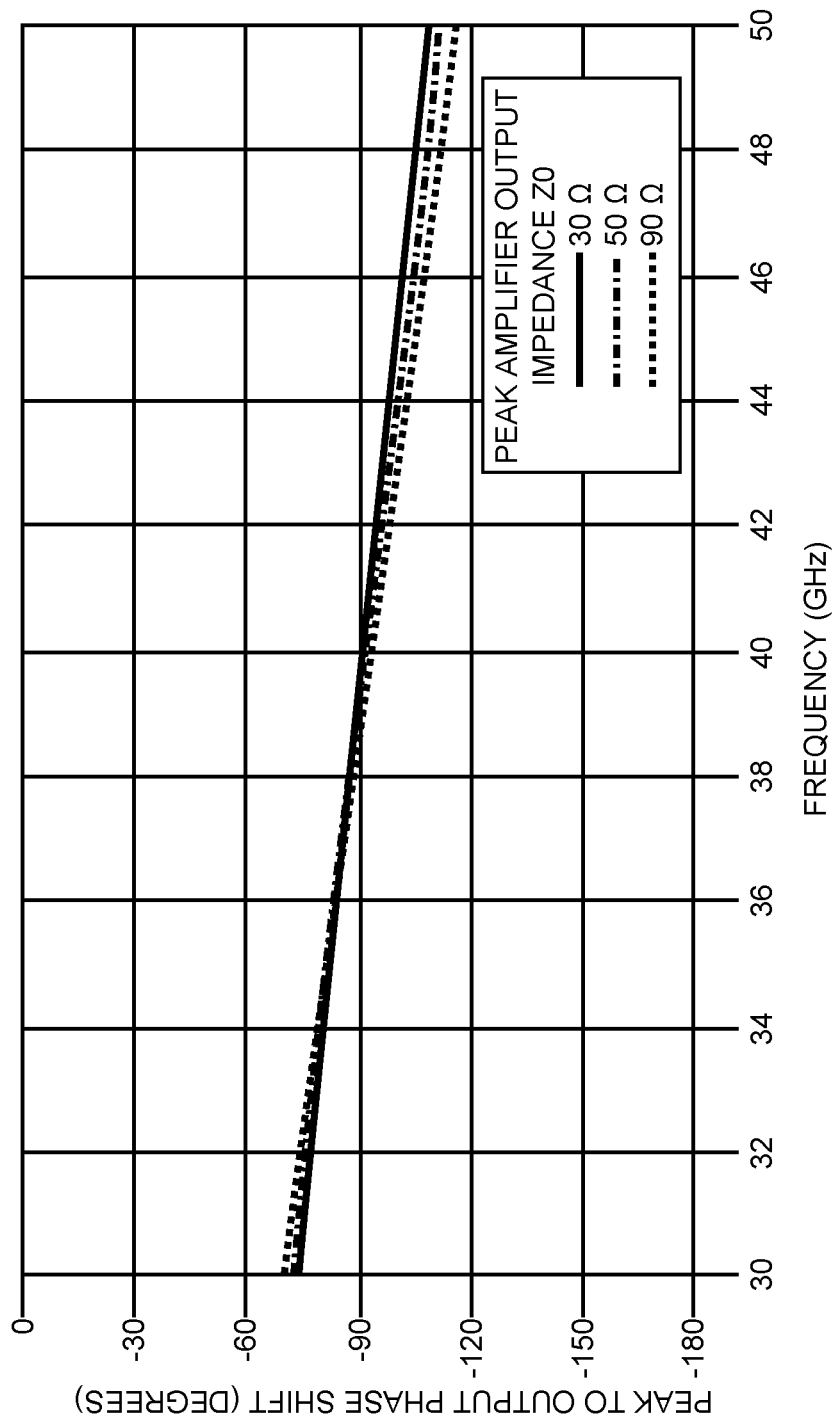
FIG. 8 is a graph of peak amplifier to output phase shift versus millimeter wave frequencies for the load modulation amplifier embodiments of the present disclosure.

FIG. 8 is a graph of peak amplifier to output phase shift versus millimeter wave frequencies for the load modulation amplifier embodiments of the present disclosure. Notice that peak amplifier output phase shift through the output quadrature coupler 14 remains within ±10° of 90° between 36 GHz and 42 GHz for output impedance Z0 of the peak amplifier ranging between 30Ω and 90Ω. In at least some embodiments, the load modulation amplifier 10 has a change in phase of no more than ±1° for output power over a 5 dB power range corresponding to half of a given OPBO range.

Figure 9:
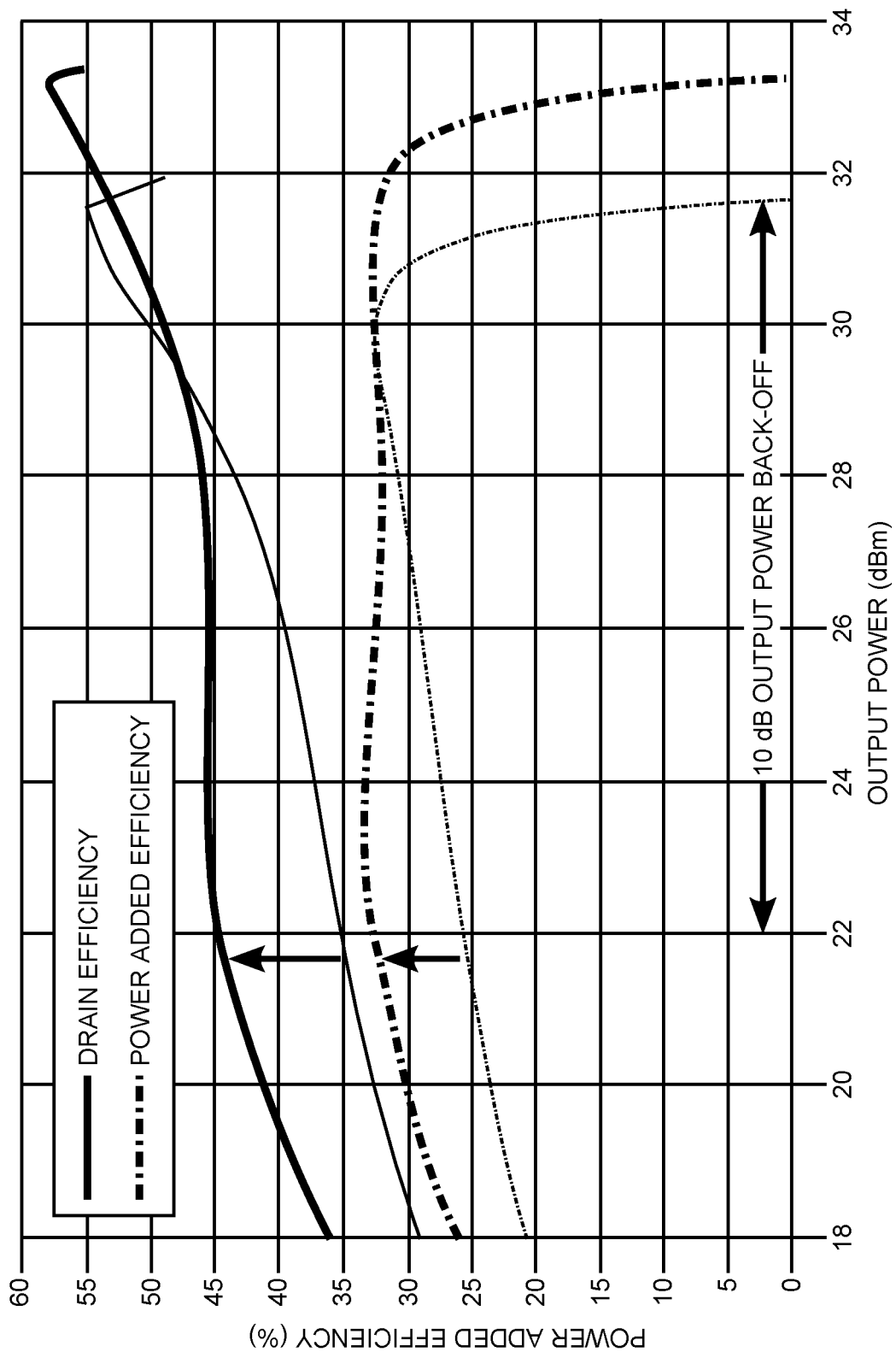
FIG. 9 is a graph of power added efficiency and drain efficiency versus output power for the second embodiment of the load modulation amplifier of FIG. 2.

FIG. 9 is a graph of power added efficiency and drain efficiency versus output power for the second embodiment of the load modulation amplifier 10 of FIG. 2. The graph of FIG. 9 was generated by running a simulation of the load modulation amplifier 10 in which the carrier amplifier 16 and the peak amplifier 18 were modeled with 0.15 micron T-gate gallium nitride high electron mobility transistor technology with a transition frequency greater than 90 GHz. A first supply voltage for the carrier amplifier was set to 10 V, while a second supply voltage for the peak amplifier was set to 18 V, and a first bias current of the carrier amplifier 16 was set to a level greater than a second bias current of peak amplifier 18 with the isolation termination network 30 being set to 0.1Ω. These settings provided an OPBO drain efficiency of at least 45% at 10 dB output power back off. Power added efficiency depicted in thick dot-dash line shows an improvement of at least 6% at 10 dB OPBO over a power added efficiency depicted in thin dot-dash line for a conventional Doherty amplifier modeled with the same 0.15 micron T-gate gallium nitride high electron mobility transistor technology with a transition frequency greater than 90 GHz. Moreover, drain efficiency depicted in thick solid line is improved by at least 8% at 10 dB OPBO over drain efficiency depicted in thin solid line for the conventional Doherty amplifier modeled with the same 0.15 micron T-gate gallium nitride high electron mobility transistor technology with a transition frequency greater than 90 GHz.

Figure 10:
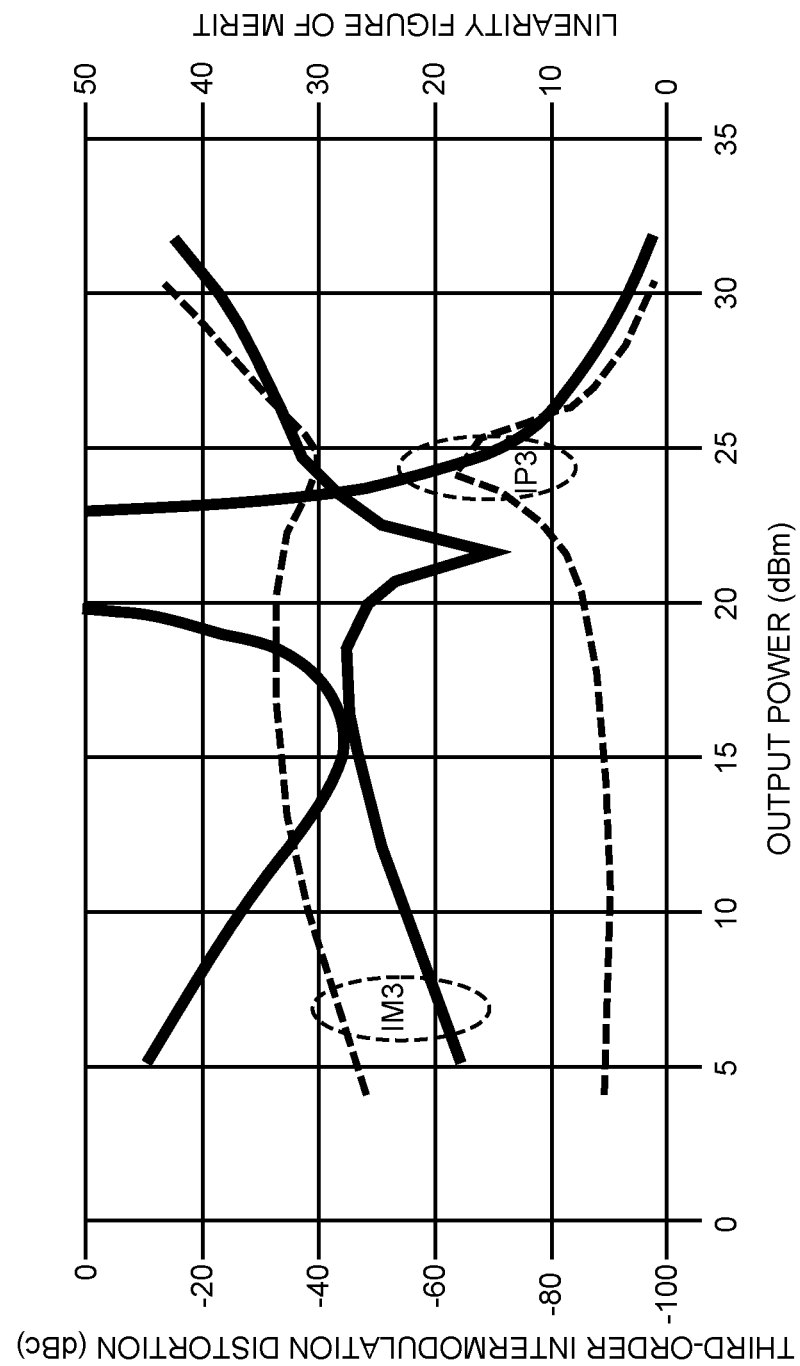
FIG. 10 is a graph of third-order intermodulation distortion (IM3) and linearity figure of merit (LFOM) as a function of output power for the second embodiment of the load modulation amplifier of FIG. 2.

FIG. 10 is a graph of third-order intermodulation distortion (IM3), third-order intercept point (IP3), and linearity figure of merit (LFOM) as a function of output power for the second embodiment of the load modulation amplifier 10 of FIG. 2. Note that the LFOM is equal to IP3 divided by dissipated power. Solid lines represent responses of IM3, IP3, and LFOM for the first embodiment of the load modulation amplifier 10 of FIG. 2, whereas dashed lines represent responses for IM3, IP3, and LFOM for a conventional Doherty amplifier modeled with the same 0.15 micron T-gate gallium nitride high electron mobility transistor technology with a transition frequency greater than 90 GHz. Notice that the load modulation amplifier 10 achieves greater than 10 dBc IM3 performance over a wide output power range between 5 dBm and 23 dBm. Especially notice that the improvement in IM3 is much greater over the conventional Doherty at 22 dBm at 10 dB OPBO. Moreover, the load modulation amplifier 10 achieves an LFOM that is greater than 25:1 over 10 dB OPBO, which is 5 times improved over the conventional Doherty amplifier.

Figure 11:
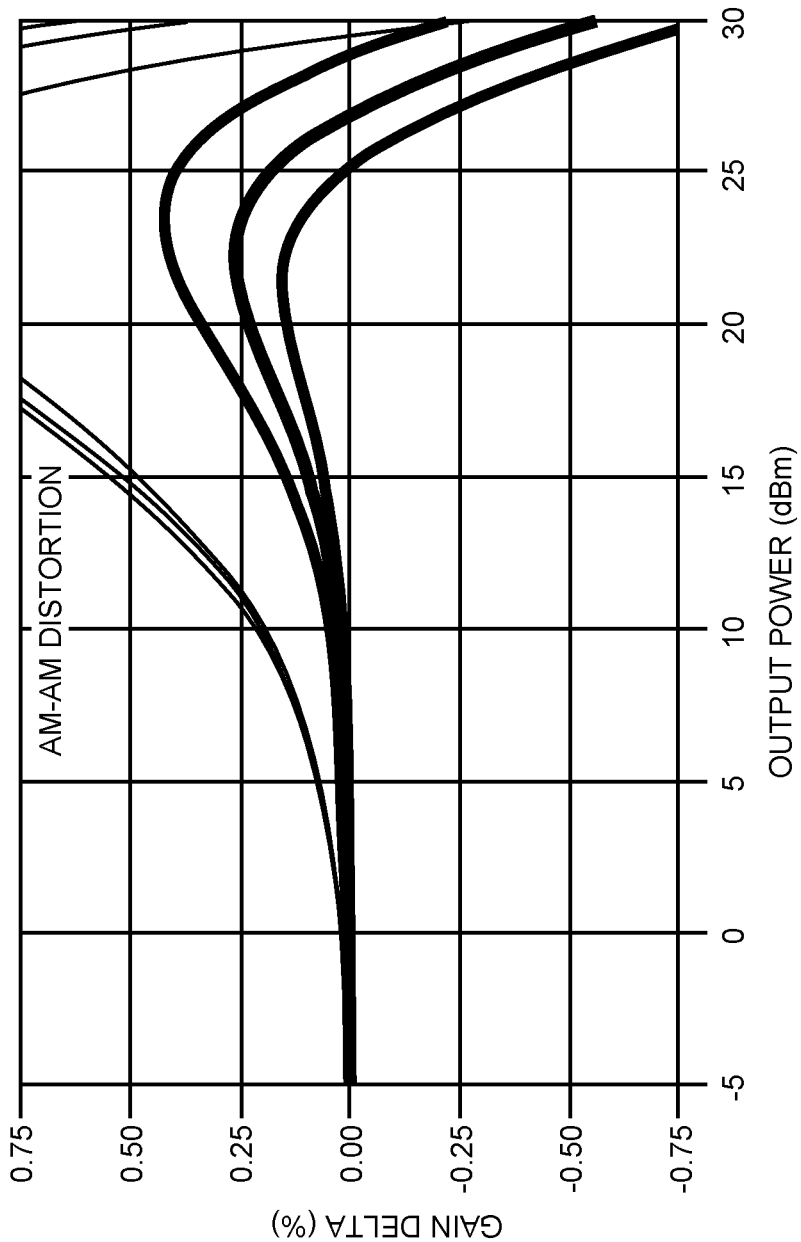
FIG. 11 is a graph of gain delta versus output power for amplitude modulation-amplitude modulation (AM-AM) distortion for the second embodiment of the load modulation amplifier of FIG. 2 versus a conventional Doherty amplifier.
Figure 12:
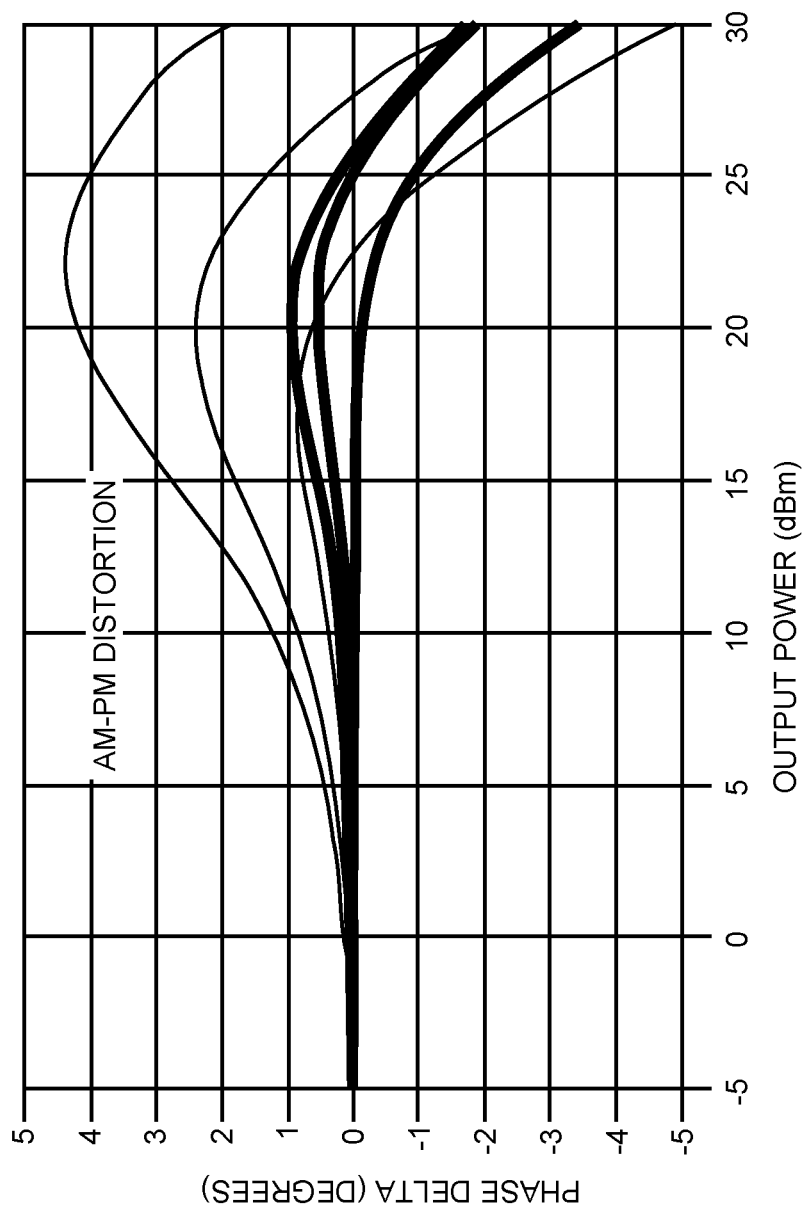
FIG. 12 is a graph of phase delta versus output power for AM-phase modulation (AM-PM) distortion for the second embodiment of the load modulation amplifier of FIG. 2 versus a conventional Doherty amplifier.

FIG. 11 is a graph of gain delta versus output power for amplitude modulation-amplitude modulation (AM-AM) distortion for the second embodiment of the load modulation amplifier 10 of FIG. 2 versus a conventional Doherty amplifier, and FIG. 12 is a graph of phase delta versus output power for AM-phase modulation (AM-PM) distortion for the second embodiment of the load modulation amplifier 10 of FIG. 2 versus a conventional Doherty amplifier. As shown in the example of FIG. 11, the first embodiment has a change in amplitude gain of no more than 0.5% for output power between 15 dBm and 25 dBm over a 39-41 GHz frequency range. In at least some embodiments, the load modulation amplifier 10 has a change in amplitude gain of no more than 0.5% for output power over a 10 dB power range corresponding to a given OPBO range. Both the load modulation amplifier 10 and the conventional Doherty amplifier were modeled with the same 0.15 micron T-gate gallium nitride high electron mobility transistor technology with a transition frequency greater than 90 GHz. Both the load modulation amplifier 10 and the conventional Doherty amplifier simulations processed a complex wireless fidelity (Wi-Fi) signal similar to 802.11ac over 80 MHz of bandwidth with a peak-to-average power ratio between 9.0 dB and 9.5 dB. FIGS. 11 and 12 give the resulting AM-AM and AM-PM distortion characteristics. Thicker solid lines represent 39 GHz, 40 GHz, and 41 GHz responses for the load modulation amplifier 10, whereas thinner solid lines represent 39 GHz, 40 GHz, and 41 GHz responses for the conventional Doherty amplifier. Both of the graphs of FIG. 11 and FIG. 12 show that the load modulation amplifier 10 has relatively dramatic improvement over the conventional Doherty amplifier.

Figure 13:
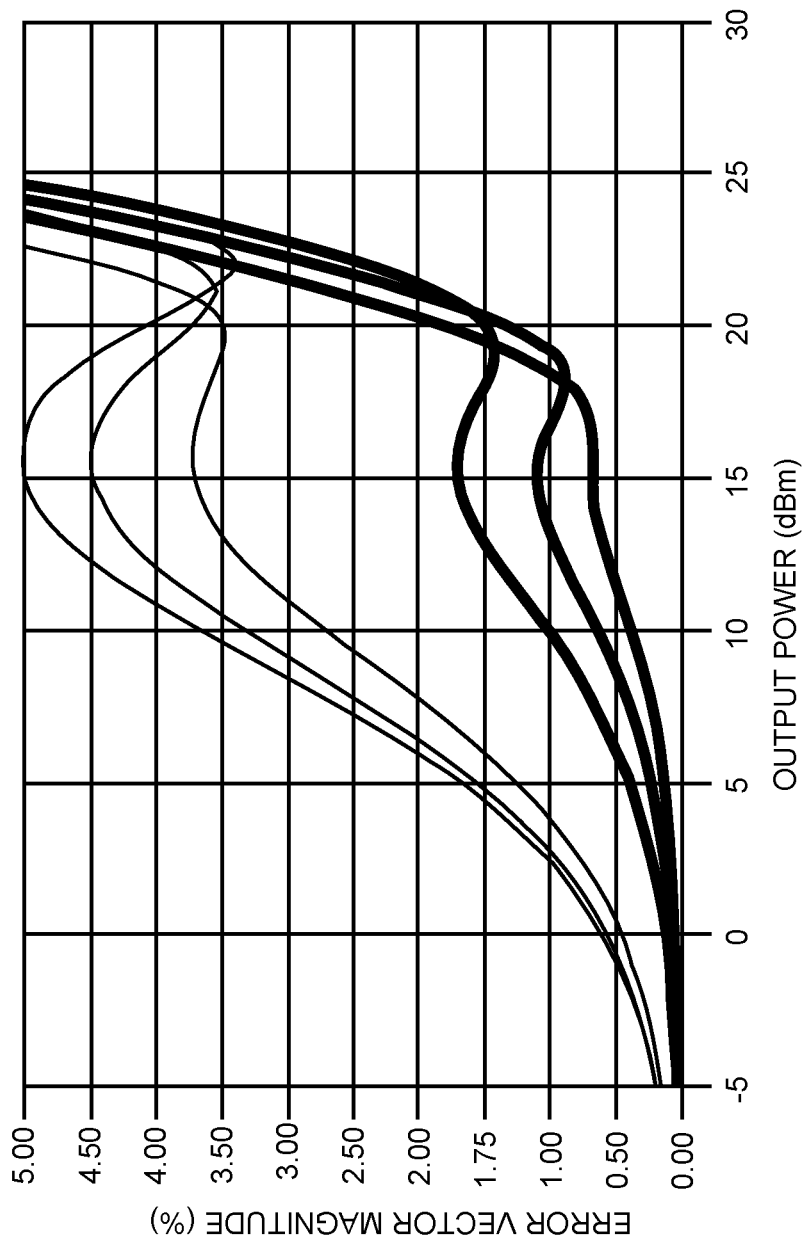
FIG. 13 is a graph of error vector magnitude (EVM) versus output power for the second embodiment of the load modulation amplifier of FIG. 2 in comparison with a conventional Doherty amplifier.

For 5G millimeter wave systems, it is believed that an error vector magnitude (EVM) lower than −26 dB may be adequate, which corresponds to −5% EVM. FIG. 13 is a graph of EVM versus output power for the second embodiment of the load modulation amplifier 10 of FIG. 2 in comparison with the conventional Doherty amplifier. Thicker solid lines represent 39 GHz, 40 GHz, and 41 GHz responses for the load modulation amplifier 10, whereas thinner solid lines represent 39 GHz, 40 GHz, and 41 GHz responses for the conventional Doherty amplifier. Both the load modulation amplifier 10 and the conventional Doherty amplifier satisfy the linear requirement an EVM lower than −26 dB up to 22 dBm of output power for a 10 dB OPBO. However, the load modulation amplifier 10 provides much lower distortion at higher OPBO levels, which illustrates an inherent linearity advantage over the conventional Doherty amplifier. For example, as shown in FIG. 13, the load modulation amplifier 10 has an EVM of no more than 2% for an output power range between 10 dBm and 20 dBm. In at least some embodiments, the load modulation amplifier 10 has an error vector magnitude of no more than 2% for an output power corresponding to a given OPBO range between 3 dB and 16 dB. As millimeter-wave communication systems evolve in the future, higher order modulation with higher peak to average power ratio will require lower EVM requirements in the couple of percent or less to achieve improved data throughput capability. As throughout, both the load modulation amplifier 10 and the conventional Doherty amplifier were modeled with the same 0.15 micron T-gate gallium nitride high electron mobility transistor technology with a transition frequency greater than 90 GHz.

Figure 14:
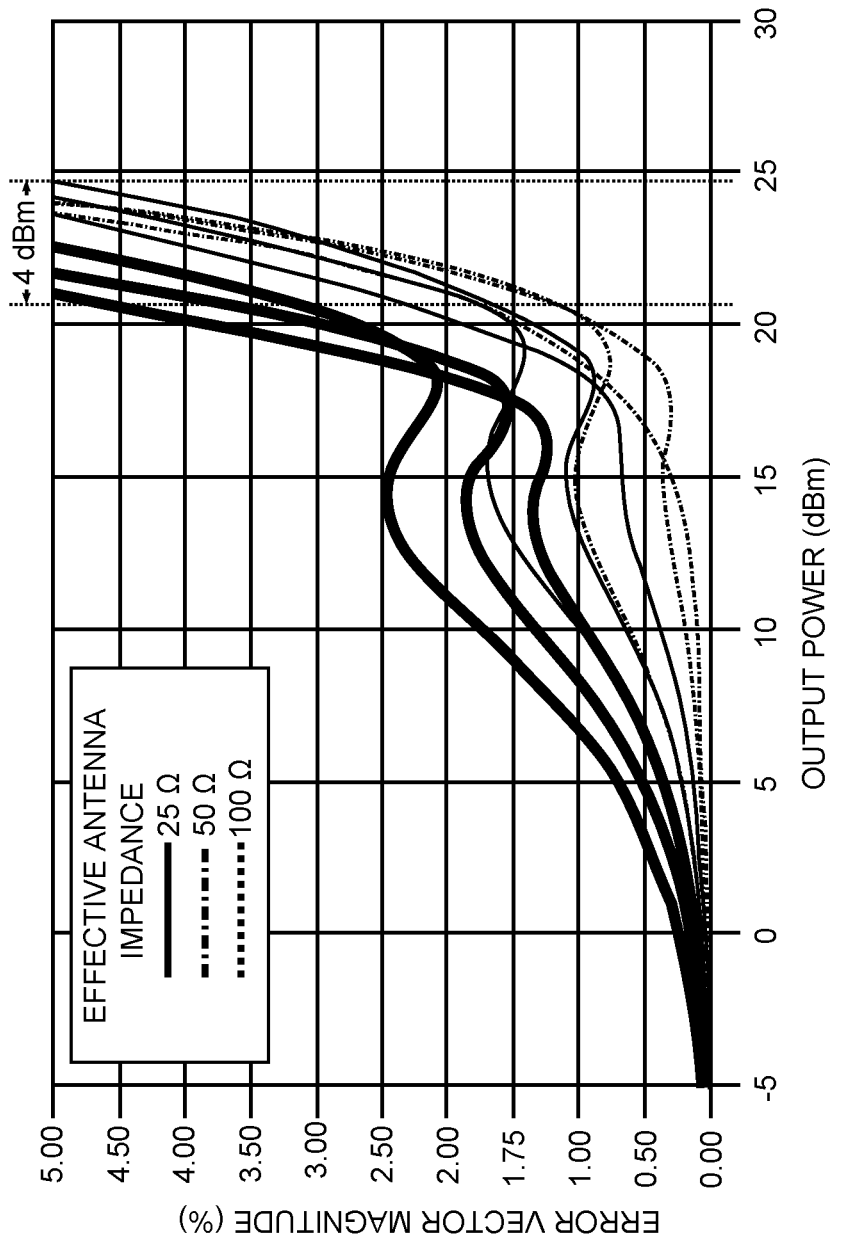
FIG. 14 is a graph of EVM under a 2:1 voltage standing wave ratio (VSWR) mismatch versus output power for the second embodiment of the load modulation amplifier of FIG. 2.
Figure 15:
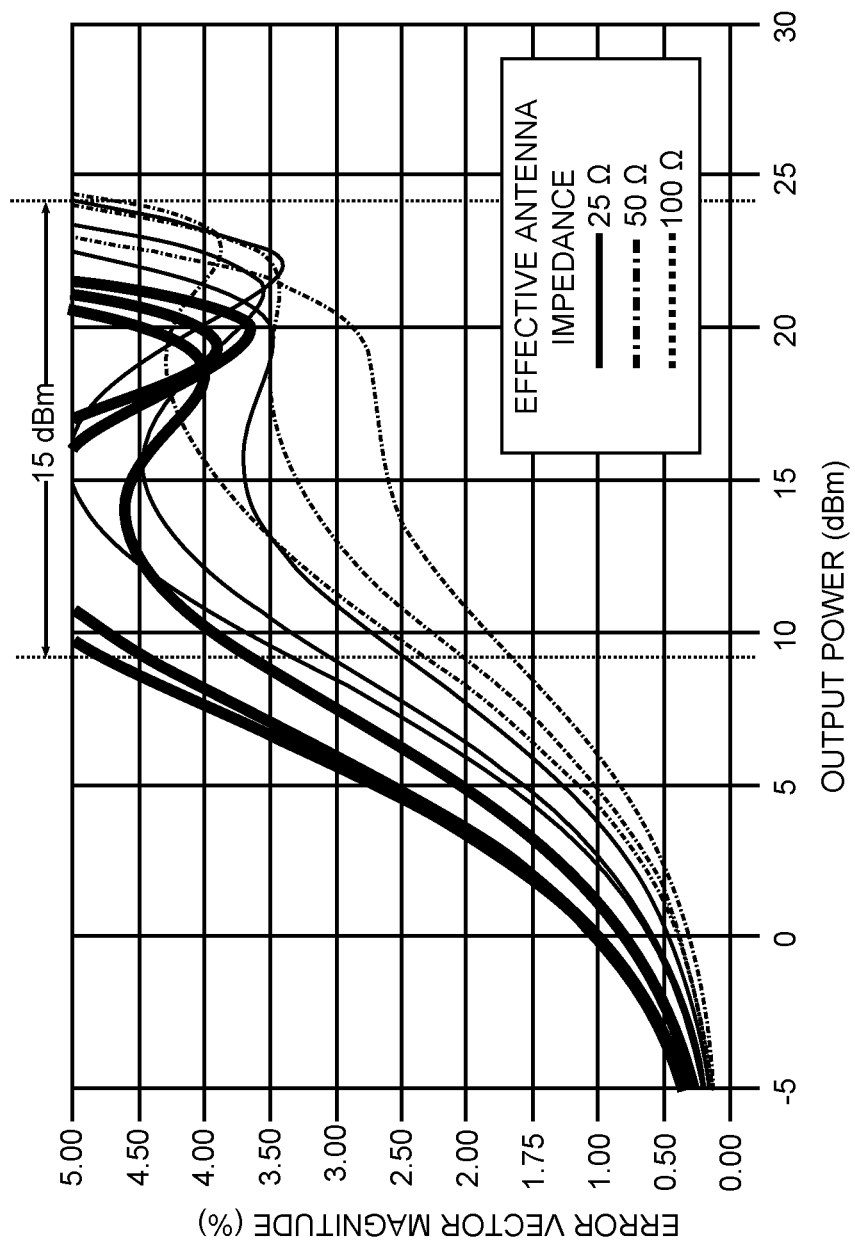
FIG. 15 is a graph of EVM under a 2:1 VSWR mismatch versus output power for conventional Doherty amplifier.

For millimeter wave communication systems, conventional power amplifiers are susceptible to a dynamically changing voltage standing wave ratio (VSWR), undesirable radio frequency interference, and variations in packaging parasitic inductances and capacitances. As a result, the load modulation amplifier 10 is configured to counter such adverse conditions. FIG. 14 is a graph of a simulation result for EVM under a 2:1 VSWR mismatch versus output power for the second embodiment of the load modulation amplifier 10 of FIG. 2. The graphed curves are associated with effective antenna impedance due to antenna VSWR mismatch, which may be due to phased antenna array scanning and/or radio frequency interference that may cause a lower than 50Ω VSWR mismatch or a higher than 50Ω VSWR mismatch. Vertical dashed lines indicate a maximum linear power range at which an EVM of −26 dB is met. The linear power range from 5 dBm to 25 dBm over the 2:1 VSWR mismatch is a relatively drastic improvement over that illustrated in FIG. 15, which is a graph of EVM under a 2:1 VSWR mismatch versus output power for a conventional Doherty amplifier. In at least some embodiments, the load modulation amplifier 10 has a maximum linear error vector magnitude for an output power corresponding to a given OPBO range between 3 dB and 16 dB over a 2:1 voltage standing wave ratio mismatch. For the purpose of comparison, the conventional Doherty amplifier was modeled with the same 0.15 micron T-gate gallium nitride high electron mobility transistor technology with a transition frequency greater than 90 GHz that was used to model the second embodiment of the load modulation amplifier 10 of FIG. 2. Moreover, for both the second embodiment of the load modulation amplifier 10 and the conventional Doherty amplifier, a first supply voltage for the carrier amplifier 16 was set to 10 V, while a second supply voltage for the peak amplifier 18 was set to 18 V, and a first bias current the carrier amplifier 16 was set to a current level greater than a second bias current of the peak amplifier 18 with the isolation termination network 30 being set to 0.1Ω.

The embodiments of the present disclosure are employable in fundamental linear efficient gallium nitride power amplifier applications. Such applications include, but are not limited to, 5G base stations, 5G millimeter phased arrays, Wi-Fi 802.11ax, CATV DOCSIS 3.1 Plus, and advanced military and defense radio communications.

Those skilled in the art will recognize improvements and modifications to the preferred embodiments of the present disclosure. All such improvements and modifications are considered within the scope of the concepts disclosed herein and the claims that follow.

What is claimed is:

1. A load modulation amplifier comprising:
    a carrier amplifier for amplifying a radio frequency signal when input power of the radio frequency signal is below a predetermined power threshold value;
    a peak amplifier coupled in parallel with the carrier amplifier for amplifying the radio frequency signal when input power of the radio frequency signal is above the predetermined power threshold value, wherein the carrier amplifier is biased with a first supply voltage and the peak amplifier is biased with a second supply voltage that is between 10% and 1000% greater than the first supply voltage; and
    an output quadrature coupler configured to combine power from both the carrier amplifier and the peak amplifier for output through an output load terminal, wherein output impedance of the peak amplifier monotonically increases with increasing output power at the output load terminal.

2. The load modulation amplifier of claim 1 wherein output impedance of the peak amplifier monotonically increases between 30Ω and 100Ω with increasing output power between 2.5 dBm and 35 dBm at the output load terminal.

3. The load modulation amplifier of claim 1 wherein output impedance of the peak amplifier monotonically increases between 30Ω and 50Ω with increasing output power between 2.5 dBm and 29 dBm at the output load terminal.

4. The load modulation amplifier of claim 1 wherein output impedance of the peak amplifier monotonically increases between 1.5 times and 4 times with increasing output power over an output power back-off range between 3 dB and 16 dB at the output load terminal.

5. The load modulation amplifier of claim 1 wherein the output quadrature coupler is a Lange coupler.

6. The load modulation amplifier of claim 1 wherein the peak amplifier is configured to couple to an isolation termination network having impedance greater than 50Ω and the carrier amplifier is coupled to the output load terminal through 0° phase shift ports of the output quadrature coupler.

7. The load modulation amplifier of claim 1 wherein the peak amplifier is configured to couple to an isolation termination network having impedance less than 50Ω, wherein the carrier amplifier is coupled to the output load terminal through 90° phase shift ports of the output quadrature coupler.

8. The load modulation amplifier of claim 1 wherein the carrier amplifier is biased with the first supply voltage and the peak amplifier is biased with the second supply voltage, wherein the second supply voltage is between 10% and 50% greater than the first supply voltage.

9. The load modulation amplifier of claim 1 wherein the carrier amplifier is biased with the first supply voltage and the peak amplifier is biased with the second supply voltage, wherein the second supply voltage is between 50% and 100% greater than the first supply voltage.

10. The load modulation amplifier of claim 1 wherein the carrier amplifier is biased with the first supply voltage and the peak amplifier is biased with the second supply voltage, wherein the second supply voltage is between 100% and 1000% greater than the first supply voltage.

11. The load modulation amplifier of claim 8 wherein bias current provided to the peak amplifier is less than bias current provided to the carrier amplifier.

12. The load modulation amplifier of claim 1 wherein the carrier amplifier is biased with the first supply voltage and the peak amplifier is biased with the second supply voltage that is different from the first supply voltage, wherein bias current provided to the peak amplifier is less than bias current provided to the carrier amplifier.

13. The load modulation amplifier of claim 1 wherein the peak amplifier comprises a matching network that provides the output impedance of the peak amplifier that increases with increasing output power at the output load terminal.

14. The load modulation amplifier of claim 13 wherein the matching network comprises only passive electrical components.

15. The load modulation amplifier of claim 1 wherein the peak amplifier is a gallium nitride amplifier.

16. The load modulation amplifier of claim 1 wherein the load modulation amplifier provides linear voltage gain between 15 GHz and 100 GHz.

17. The load modulation amplifier of claim 1 wherein the load modulation amplifier provides linear voltage gain between 30 GHz and 50 GHz.

18. The load modulation amplifier of claim 1 having a change in amplitude gain of no more than 0.5% for output power over a 10 dB power range corresponding to a given output power back-off range.

19. The load modulation amplifier of claim 1 having a change in phase of no more than ±1° for output power over a 5 dB power range corresponding to half of a given output power back-off range.

20. The load modulation amplifier of claim 1 having an error vector magnitude of no more than 2% for an output power corresponding to a given output power back-off range between 3 dB and 16 dB.

21. The load modulation amplifier of claim 1 having maximum linear error vector magnitude for an output power corresponding to a given output power back-off range between 3 dB and 16 dB over a 2:1 voltage standing wave ratio mismatch.

* * * * *